United States Patent
Inoue et al.

(10) Patent No.: US 7,485,902 B2
(45) Date of Patent: Feb. 3, 2009

(54) NITRIDE-BASED SEMICONDUCTOR LIGHT-EMITTING DEVICE

(75) Inventors: Daijiro Inoue, Kyoto (JP); Yasuhiko Nomura, Moriguchi (JP); Masayuki Hata, Kadoma (JP); Takashi Kano, Hirakata (JP); Tsutomu Yamaguchi, Nara (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/663,714

(22) Filed: Sep. 17, 2003

(65) Prior Publication Data

US 2004/0061119 A1 Apr. 1, 2004

(30) Foreign Application Priority Data

Sep. 18, 2002 (JP) ............................. 2002-271968

(51) Int. Cl.
*H01L 27/15* (2006.01)
(52) U.S. Cl. ................... 257/103; 257/98; 257/744; 257/745; 257/E33.005; 257/E33.028; 257/E33.064
(58) Field of Classification Search ................. 257/103, 257/22, 96–97, 13, 76, 744, 745, 98; 438/25, 438/27
See application file for complete search history.

(56) References Cited

U.S. PATENT DOCUMENTS

| | | | | |
|---|---|---|---|---|
| 6,103,543 | A * | 8/2000 | Uemura et al. | 438/46 |
| 6,462,354 | B1 * | 10/2002 | Okuyama | 257/13 |
| 6,555,403 | B1 | 4/2003 | Domen et al. | |
| 6,574,256 | B1 * | 6/2003 | Hofstetter et al. | 372/45.01 |
| 6,835,956 | B1 | 12/2004 | Nagahama et al. | |
| 2002/0003234 | A1 * | 1/2002 | Hayashi et al. | 257/88 |
| 2002/0074556 | A1 * | 6/2002 | Kwak et al. | 257/79 |
| 2002/0190263 | A1 * | 12/2002 | Hata et al. | 257/103 |
| 2003/0010993 | A1 * | 1/2003 | Nakamura et al. | 257/99 |
| 2003/0030068 | A1 * | 2/2003 | Hata et al. | 257/103 |
| 2005/0082575 | A1 * | 4/2005 | Chen et al. | 257/202 |
| 2005/0127394 | A1 * | 6/2005 | Nagahama et al. | 257/103 |

(Continued)

FOREIGN PATENT DOCUMENTS

CN 1265228 A 8/2000

(Continued)

OTHER PUBLICATIONS

T. Asano, et al. "High-power 400-nm-band AlGaInN-based laser diodes with low aspect ratio." Applied Physics Letters, vol. 80. No. 19, May 13, 2002, pp. 3497-3499.

(Continued)

*Primary Examiner*—Ahmed Sefer
(74) *Attorney, Agent, or Firm*—McDermott Will & Emery LLP

(57) ABSTRACT

A nitride-based semiconductor light-emitting device capable of improving luminous efficiency by reducing light absorption loss in a contact layer is provided. This nitride-based semiconductor light-emitting device comprises a first conductivity type first nitride-based semiconductor layer formed on a substrate, an active layer, formed on the first nitride-based semiconductor layer, consisting of a nitride-based semiconductor layer, a second conductivity type second nitride-based semiconductor layer formed on the active layer, an undoped contact layer formed on the second nitride-based semiconductor layer and an electrode formed on the undoped contact layer.

22 Claims, 11 Drawing Sheets

U.S. PATENT DOCUMENTS

| | | | |
|---|---|---|---|
| 2005/0145860 A1* | 7/2005 | Tanizawa | 257/85 |
| 2005/0167693 A1* | 8/2005 | Goetz et al. | 257/103 |
| 2005/0211971 A1* | 9/2005 | Okumura | 257/14 |

FOREIGN PATENT DOCUMENTS

| | | | |
|---|---|---|---|
| CN | 1340215 A | | 3/2002 |
| EP | 1063711 | * | 12/2000 |
| JP | 9-232680 | * | 9/1977 |
| JP | 10-215034 | * | 1/1997 |
| JP | 10-294529 | | 11/1998 |
| JP | 11-145518 | * | 5/1999 |
| JP | 11-340580 | | 12/1999 |
| JP | 2000-101142 | * | 4/2000 |
| JP | 2000-299497 | * | 10/2000 |
| JP | 2001-7392 | | 1/2001 |
| JP | 2001-53338 | | 2/2001 |
| JP | 2001-57461 | | 2/2001 |
| JP | 2001-60720 A | | 3/2001 |
| JP | 2001-77412 | * | 3/2001 |
| JP | 2001-196700 | * | 7/2001 |
| JP | 2002-124737 | | 4/2002 |
| JP | 2002-299768 | | 10/2002 |
| JP | 2003-243772 | * | 8/2003 |
| JP | 2004-165287 | * | 6/2004 |

OTHER PUBLICATIONS

Nishinaga Tatau, "Hetero-epitaxy with Large Lattice Mismatch and Microchannel Epitaxy of Compound Semiconductor." Department of Electronic Engineering, Graduate School of Engineering, vol. 21, No. 6, pp. 320-325, 2000.

Takashi Mizuno, et al. "High power Blue-violet Laser Diodes." The Institute of Electronics, Information and Communication Engineers, Technical Report of IEICE. ED2002-112, LQE2002-87 (Jun. 2002), pp. 63-66.

H. Amano, et al. "Metalorganic vapor phase epitaxial growth of a high quality GaN film using an AlN buffer layer." Appl. Phys. Lett., vol. 48, No. 5, Feb. 3, 1986. pp. 353-355.

Chinese Office Action issued in corresponding Chinese Patent Application No. 03159402.6, dated Jan. 19, 2007.

Japanese Office Action issued in corresponding Japanese Patent Application No. 2003-319528, dated Feb. 13, 2007.

Japanese Office Action with English Translation issued in Japanese Patent Application No. 2003-319528 dated on Feb. 19, 2008.

* cited by examiner

NITRIDE-BASED SEMICONDUCTOR LIGHT-EMITTING DEVICE

BACKGROUND OF THE INVENTION

1. Field of the Invention

The present invention relates to a nitride-based semiconductor light-emitting device, and more particularly, it relates to a nitride-based semiconductor light-emitting device having nitride-based semiconductor layers formed on a substrate.

2. Description of the Background Art

A nitride-based semiconductor light-emitting device such as a nitride-based semiconductor light-emitting diode (LED) or a nitride-based semiconductor laser diode (LD) consisting of $In_XAl_YGa_{1-X-Y}N$ ($0 \leq X$, $0 \leq Y$, $X+Y \leq 1$) has recently been put into practice.

A conventional nitride-based semiconductor light-emitting device basically has a double heterostructure obtained by successively stacking an n-type nitride-based semiconductor layer consisting of n-type $Al_YGa_{1-Y}N$ ($0 \leq Y \leq 1$), an active layer consisting of $In_XGa_{1-X}N$ ($0 \leq X \leq 1$) and a p-type nitride-based semiconductor layer consisting of p-type $Al_ZGa_{1-Z}N$ ($0 \leq Z \leq 1$) on a substrate. In general, the nitride-based semiconductor light-emitting device further comprises an n-type contact layer for implementing ohmic contact with an n-side electrode and a p-type contact layer for implementing ohmic contact with a p-side electrode. A conventional nitride-based semiconductor laser diode may have an n-type optical guide layer and a p-type optical guide layer formed to hold an active layer therebetween.

The n- or p-type nitride-based semiconductor layer of the aforementioned nitride-based semiconductor light-emitting device is prepared by doping a nitride-based semiconductor with dopants providing n-type carriers (electrons) or p-type carriers (holes). In order to obtain a nitride-based semiconductor light-emitting device having excellent luminous efficiency, it is inevitably necessary to suppress light absorption in each nitride-based semiconductor layer. However, the activation efficiency of the dopants for the p-type nitride-based semiconductor is so low that the dopants must be doped in a large quantity in order to obtain a p-type nitride-based semiconductor having prescribed carrier concentration in general. In this case, light absorption is inconveniently increased in a p-type contact layer or a p-type optical guide layer having a small band gap due to dopant levels resulting from introduction of the large quantity of dopant in the p-type nitride-based semiconductor. The light absorption is further increased also by crystal defects resulting from the large quantity of dopant.

In general, therefore, there is proposed a nitride-based semiconductor laser diode capable of reducing light absorption resulting from the dopants by forming an undoped optical guide layer on an active layer in place of the p-type optical guide layer, as disclosed in "Technical Report of IEICE", the Institute of Electronics, Information and Communication Engineers, Jun. 15, 2002, pp. 63-66, for example.

However, the aforementioned proposed conventional nitride-based semiconductor laser diode has no countermeasure for preventing a p-type contact layer from light absorption. The p-type contact layer is doped with a large quantity of dopant for implementing ohmic contact with a p-side electrode. Also when light absorption is reduced in the aforementioned undoped optical guide layer, therefore, it is difficult to inhibit the p-type contact layer from light absorption resulting from the dopants. Consequently, it is disadvantageously difficult to improve luminous efficiency of the nitride-based semiconductor laser diode. In a nitride-based semiconductor light-emitting diode emitting light through a p-type contact layer, influence exerted on emission characteristics of the nitride-based semiconductor light-emitting device is disadvantageously increased if light absorption is increased in the p-type contact layer.

On the other hand, there is also proposed a technique of forming a contact layer having a modulation doped superlattice structure by alternately stacking undoped nitride-based semiconductor layers and p-type nitride-based semiconductor layers doped with dopants, as disclosed in Japanese Patent Laying-Open No. 2001-60720, for example.

In the aforementioned technique disclosed in Japanese Patent Laying-Open No. 2001-60720, however, the dopants may diffuse into the undoped nitride-based semiconductor layer from the nitride-based semiconductor layers doped with the dopants arranged on both sides (upper and lower sides) of the undoped nitride-based semiconductor layer in the contact layer. In this case, it is difficult to inhibit the contact layer from light absorption due to dopant levels formed in the intentionally undoped nitride-based semiconductor layer. Consequently, it is disadvantageously difficult to improve luminous efficiency of the nitride-based semiconductor light-emitting device despite the modulation doped superlattice structure of the contact layer formed by stacking the undoped nitride-based semiconductor layer and the p-type nitride-based semiconductor layers doped with the dopants.

In order to inhibit a p-type contact layer from light absorption, a p-type nitride-based semiconductor layer having a large band gap may be employed as the p-type contact layer thereby suppressing light absorption. When the band gap of the p-type contact layer is increased, however, a barrier at the interface between the p-type contact layer and a p-side electrode is so increased that it is difficult to implement excellent ohmic contact between the p-type contact layer and the p-side electrode. Thus, the nitride-based semiconductor light-emitting device is disadvantageously reduced in luminous efficiency and increased in operation voltage.

SUMMARY OF THE INVENTION

An object of the present invention is to provide a nitride-based semiconductor light-emitting device capable of improving luminous efficiency by reducing light absorption loss in a contact layer.

In order to attain the aforementioned object, a nitride-based semiconductor light-emitting device according to an aspect of the present invention comprises a first conductivity type first nitride-based semiconductor layer formed on a substrate, an active layer, formed on the first nitride-based semiconductor layer, consisting of a nitride-based semiconductor layer, a second conductivity type second nitride-based semiconductor layer formed on the active layer, an undoped contact layer formed on the second nitride-based semiconductor layer and an electrode formed on the undoped contact layer. Throughout the specification, the term "undoped" denotes a state not intentionally doped with a dopant. Therefore, not only a state doped with absolutely no dopant but also a state unintentionally mixed with a small quantity of dopant corresponds to the term "undoped" in the present invention.

In the nitride-based semiconductor light-emitting device according to this aspect, as hereinabove described, the undoped contact layer formed with no dopant levels can be inhibited from light absorption resulting from dopant levels. Further, the undoped contact layer having no crystal defects resulting from doping exhibits excellent crystal quality. Therefore, the undoped contact layer can also be inhibited from light absorption resulting from crystal defects. Thus, light absorption loss in the undoped contact layer can be so reduced that luminous efficiency can be improved.

In the nitride-based semiconductor light-emitting device according to the aforementioned aspect, the band gap of the undoped contact layer is preferably smaller than the band gap of the second nitride-based semiconductor layer. According to this structure, the energy barrier is so reduced at the interface between the undoped contact layer and the electrode that ohmic contact between the undoped contact layer and the electrode can be easily implemented. Thus, the luminous efficiency can be further improved and an operation voltage can be reduced.

In the nitride-based semiconductor light-emitting device according to the aforementioned aspect, the second conductivity type second nitride-based semiconductor layer preferably includes a second conductivity type cladding layer consisting of AlGaN. According to this structure, the band gap of the second nitride-based semiconductor layer can be so easily increased that light absorption can be reduced in the cladding layer consisting of the second nitride-based semiconductor layer.

In the nitride-based semiconductor light-emitting device according to the aforementioned aspect, the first conductivity type first nitride-based semiconductor layer is preferably an n-type first nitride-based semiconductor layer, and the second conductivity type second nitride-based semiconductor layer is preferably a p-type second nitride-based semiconductor layer.

In the nitride-based semiconductor light-emitting device according to the aforementioned aspect, the undoped contact layer preferably has a thickness of at least about 1 nm and not more than about 10 nm. According to this structure, contact resistance between the undoped contact layer and the electrode can be so reduced that excellent ohmic contact can be attained between the undoped contact layer and the electrode. Further, resistance of the undoped contact layer can be reduced.

In the nitride-based semiconductor light-emitting device according to the aforementioned aspect, the undoped contact layer preferably has a band gap larger than the band gap of the active layer. When the active layer is constituted of a single material, the term "the band gap of the active layer" denotes the band gap of the material. When the active layer has a multilayer structure such as a quantum well structure, the term "the band gap of the active layer" denotes the energy gap between two quantum levels (ground states) formed in the conduction band and the valence band. According to this structure, light absorption in the undoped contact layer can be easily reduced. In this case, the undoped contact layer preferably contains InGaN. According to this structure, the band gap of the undoped contact layer can be easily reduced beyond that of the second nitride-based semiconductor layer.

In the nitride-based semiconductor light-emitting device according to the aforementioned aspect, the undoped contact layer may contain GaN.

In the nitride-based semiconductor light-emitting device according to the aforementioned aspect, the undoped contact layer is preferably constituted of a single undoped nitride-based semiconductor layer. According to this structure, the undoped contact layer can be inhibited from diffusion of the dopant as compared with a contact layer having a modulation doped superlattice structure consisting of undoped nitride-based semiconductor layers and doped nitride-based semiconductor layers.

In the nitride-based semiconductor light-emitting device according to the aforementioned aspect, the undoped contact layer may have a multilayer structure such as a superlattice structure consisting of a plurality of undoped nitride-based semiconductor layers.

The nitride-based semiconductor light-emitting device according to the aforementioned aspect preferably further comprises an undoped third nitride-based semiconductor layer, formed at least between the active layer and the second conductivity type second nitride-based semiconductor layer, consisting of a nitride-based semiconductor having a smaller band gap than the second nitride-based semiconductor layer. According to this structure, the third nitride-based semiconductor layer can control emission characteristics such as optical beam divergence, and can be inhibited from light absorption.

In this case, the undoped third nitride-based semiconductor layer is preferably formed only between the active layer and the second nitride-based semiconductor layer in the interspaces between the active layer and the first and second conductivity type first and second nitride-based semiconductor layers. According to this structure, a region having high light intensity formed in the active layer deviates toward the second nitride-based semiconductor layer, thereby inhibiting the first conductivity type first nitride-based semiconductor layer from light absorption. Also when the region having high light intensity deviates toward the second nitride-based semiconductor layer in this case, the undoped contact layer provided on the second nitride-based semiconductor layer is formed with no dopant levels or crystal defects, whereby light absorption is not increased. Consequently, the effect of improving the luminous efficiency of the nitride-based semiconductor light-emitting device is increased.

In this case, the nitride-based semiconductor light-emitting device preferably further comprises a fourth nitride-based semiconductor layer formed between the active layer and the first conductivity type first nitride-based semiconductor layer, and the fourth nitride-based semiconductor layer preferably has a thickness smaller than the thickness of the third nitride-based semiconductor layer. According to this structure, the region having high light intensity formed in the active layer deviates toward the second nitride-based semiconductor layer, whereby the first conductivity type first nitride-based semiconductor layer is inhibited from light absorption. Also when the region having high light intensity deviates toward the second nitride-based semiconductor layer in this case, the undoped contact layer provided on the second nitride-based semiconductor layer is formed with no dopant levels or crystal defect, whereby light absorption is not increased. Consequently, the effect of improving the luminous efficiency of the nitride-based semiconductor light-emitting device is increased.

In this case, the second conductivity type second nitride-based semiconductor layer preferably includes a second conductivity type second nitride-based semiconductor layer consisting of AlGaN, and the undoped third nitride-based semiconductor layer preferably includes an undoped third nitride-based semiconductor layer consisting of GaN. According to this structure, the band gap of the third nitride-based semiconductor layer can be easily reduced beyond that of the second nitride-based semiconductor layer.

In the nitride-based semiconductor light-emitting device according to the aforementioned aspect, the second conductivity type second nitride-based semiconductor layer preferably includes a second conductivity type cladding layer having a projecting portion, the undoped contact layer is preferably formed on the upper surface of the projecting portion of the second conductivity type cladding layer, and the projecting portion of the second conductivity type cladding layer and the undoped contact layer preferably constitute a ridge portion. According to this structure, the ridge portion serving as a current path region can be easily formed.

In the nitride-based semiconductor light-emitting device according to the aforementioned aspect, the active layer preferably includes an active layer consisting of a nitride-based semiconductor containing In, and the nitride-based semiconductor light-emitting device preferably further comprises a protective layer of a nitride-based semiconductor layer formed on the active layer for preventing In atoms in the active layer from desorption. According to this structure, the protective layer prevents In atoms in the active layer from desorption, whereby the active layer can be prevented from deterioration of crystal quality.

In the nitride-based semiconductor light-emitting device according to the aforementioned aspect, the first conductivity type first nitride-based semiconductor layer preferably includes a first conductivity type contact layer, and the first conductivity type contact layer preferably also has a function for serving as a first conductivity type cladding layer.

In this case, the substrate preferably includes an insulating substrate. According to this structure, the nitride-based semiconductor light-emitting device having the insulating substrate can be easily obtained by providing the electrode on the contact layer also serving as a cladding layer.

In the nitride-based semiconductor light-emitting device according to the aforementioned aspect, the electrode provided on the undoped contact layer is preferably interdigitally formed. According to this structure, the nitride-based semiconductor light-emitting device can emit light from gaps of the interdigitally formed electrode.

The nitride-based semiconductor light-emitting device according to the aforementioned aspect preferably further comprises an undoped fifth nitride-based semiconductor layer formed between the substrate and the first conductivity type first nitride-based semiconductor layer. According to this structure, the undoped fifth nitride-based semiconductor layer has no crystal defects resulting from doping, whereby the nitride-based semiconductor layers, i.e., the first nitride-based semiconductor layer, the active layer, the second nitride-based semiconductor layer and the undoped contact layer successively formed on the fifth nitride-based semiconductor layer can be further inhibited from formation of crystal defects. Thus, the nitride-based semiconductor layers, i.e., the first nitride-based semiconductor layer, the active layer, the second nitride-based semiconductor layer and the undoped contact layer can be formed with smaller numbers of crystal defects, whereby the nitride-based semiconductor light-emitting device can be further inhibited from light absorption resulting from crystal defects. Consequently, the nitride-based semiconductor light-emitting device can be formed with higher luminous efficiency.

In this case, the undoped fifth nitride-based semiconductor layer is preferably constituted of a nitride-based semiconductor having a low dislocation density formed by selective lateral growth. According to this structure, not only crystal defects resulting from doping but also other crystal defects can be reduced in the low-dislocation fifth nitride-based semiconductor layer, whereby the nitride-based semiconductor layers, i.e., the first nitride-based semiconductor layer, the active layer, the second nitride-based semiconductor layer and the undoped contact layer successively formed on the fifth nitride-based semiconductor layer can be further inhibited from formation of crystal defects.

In this case, the nitride-based semiconductor light-emitting device preferably further comprises a plurality of mask layers having overhangs formed on the substrate at prescribed intervals, and the undoped fifth nitride-based semiconductor layer is preferably formed by selective lateral growth to fill up clearances between the mask layers. According to this structure, triangular portions of the fifth nitride-based semiconductor layer are formed around the centers of the clearances between the mask layers while other triangular portions of the fifth nitride-based semiconductor layer smaller than those located around the centers of the clearances between the mask layers are formed under the overhangs of the mask layers from the initial growth stage. Thus, the fifth nitride-based semiconductor layer laterally grows from the initial growth stage, thereby laterally bending dislocations formed therein from the initial growth stage. Thus, the fifth nitride semiconductor layer reduced in dislocation density can be formed with a smaller thickness.

In the nitride-based semiconductor light-emitting device according to the aforementioned aspect, the substrate is preferably a first conductivity type GaN substrate. According to this structure, the nitride-based semiconductor light-emitting device having the first conductivity type GaN substrate can be easily improved in luminous efficiency.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a nitride-based semiconductor light-emitting diode according to a first embodiment of the present invention is described with reference to FIGS. 1 and 2.

Figure 1:
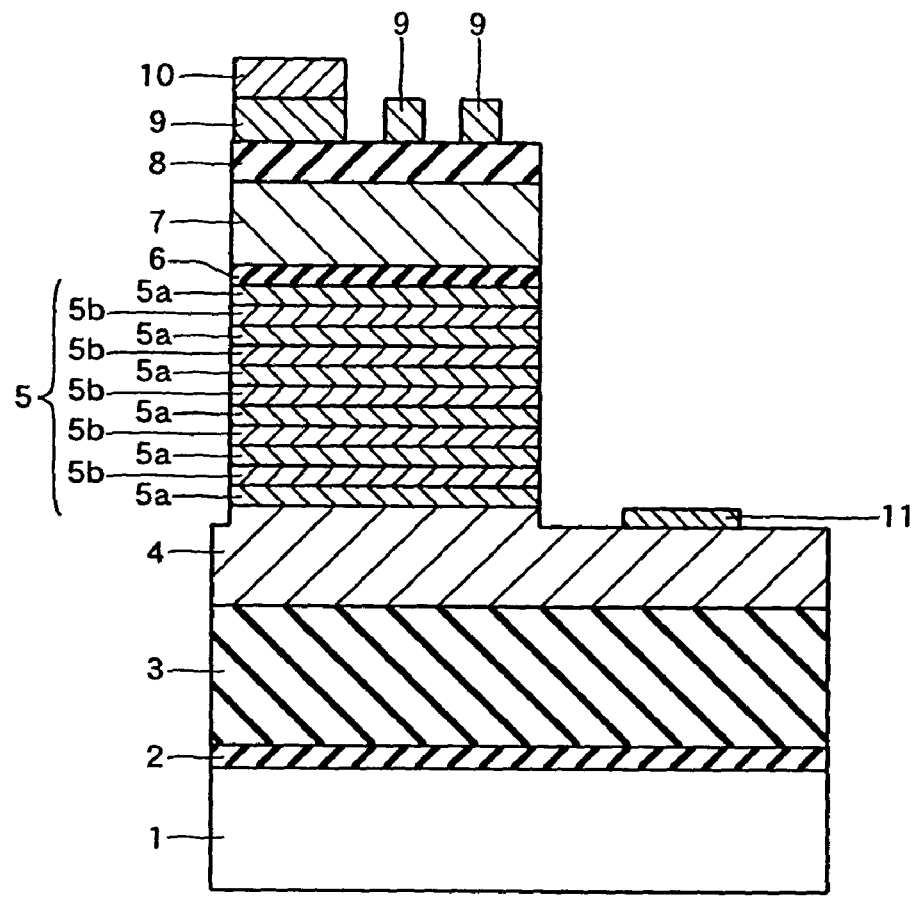
FIG. 1 is a sectional view showing a nitride-based semiconductor light-emitting diode (blue LED chip) according to a first embodiment of the present invention.

In the nitride-based semiconductor light-emitting diode according to the first embodiment, a low-temperature buffer layer 2 of AlGaN having a thickness of about 10 nm is formed on the (0001) plane of a sapphire substrate 1, as shown in FIG. 1. The sapphire substrate 1 is an example of the "substrate" or the "insulating substrate" in the present invention. A high-temperature buffer layer 3 of undoped GaN having a thickness of about 1 µm is formed on the low-temperature buffer layer 2. An n-type contact layer 4 of n-type GaN doped with Si having a thickness of about 5 µm is formed on the high-temperature buffer layer 3. The n-type contact layer 4 is partially removed to have a projecting portion. The n-type contact layer 4 also serves as an n-type cladding layer. The n-type contact layer 4 is an example of the "first nitride-based semiconductor layer" in the present invention.

An MQW active layer 5 having a multiple quantum well (MQW) structure formed by stacking six barrier layers 5a of undoped $In_{0.15}Ga_{0.85}N$ each having a thickness of about 5 nm and five well layers 5b of undoped $In_{0.35}Ga_{0.65}N$ each having a thickness of about 5 nm is formed to be substantially entirely in contact with the upper surface of the projecting portion of the n-type contact layer 4. The MQW active layer 5 is an example of the "active layer" in the present invention. A protective layer 6 of undoped GaN having a thickness of about 10 nm is formed on the MQW active layer 5. The protective layer 6 has a function of preventing In atoms in the MQW active layer 5 from desorption thereby preventing the MQW active layer 5 from deterioration of crystal quality.

According to the first embodiment, a p-type cladding layer 7 of p-type $Al_{0.05}Ga_{0.95}N$ doped with Mg having an atomic density of about $3\times10^{19}$ cm$^{-3}$ and a carrier concentration of about $1\times10^{18}$ cm$^{-3}$ is formed on the protective layer 6 with a thickness of about 0.15 µm. The p-type cladding layer 7 is an example of the "second nitride-based semiconductor layer" or the "cladding layer" in the present invention. According to the first embodiment, further, an undoped contact layer 8 of undoped $In_{0.15}Ga_{0.85}N$ having a thickness of about 1 nm to about 10 nm is formed on the p-type cladding layer 7. The band gap of the undoped contact layer 8 consisting of undoped $In_{0.15}Ga_{0.85}N$ is smaller than the band gap of the p-type cladding layer 7 consisting of p-type $Al_{0.05}Ga_{0.95}N$ and larger than the band gap of the MQW active layer 5 consisting of undoped $In_{0.15}Ga_{0.85}N$ and undoped $In_{0.35}Ga_{0.65}N$. The term "the band gap of the MQW active layer 5" denotes the energy gap between two quantum levels (ground states) formed in the conduction band and the valence band. The energy gap between the quantum levels of the MQW active layer 5 constituted of $In_{0.15}Ga_{0.85}N$ and $In_{0.35}Ga_{0.65}N$ is smaller than the band gap of the undoped contact layer 8 consisting of $In_{0.15}Ga_{0.85}N$.

An interdigital p-side electrode 9 constituted of a Pd film having a thickness of about 100 nm and an Au film having a thickness of about 100 nm in ascending order is formed on the upper surface of the undoped contact layer 8. The p-side electrode 9 is an example of the "electrode" in the present invention.

Figure 3:
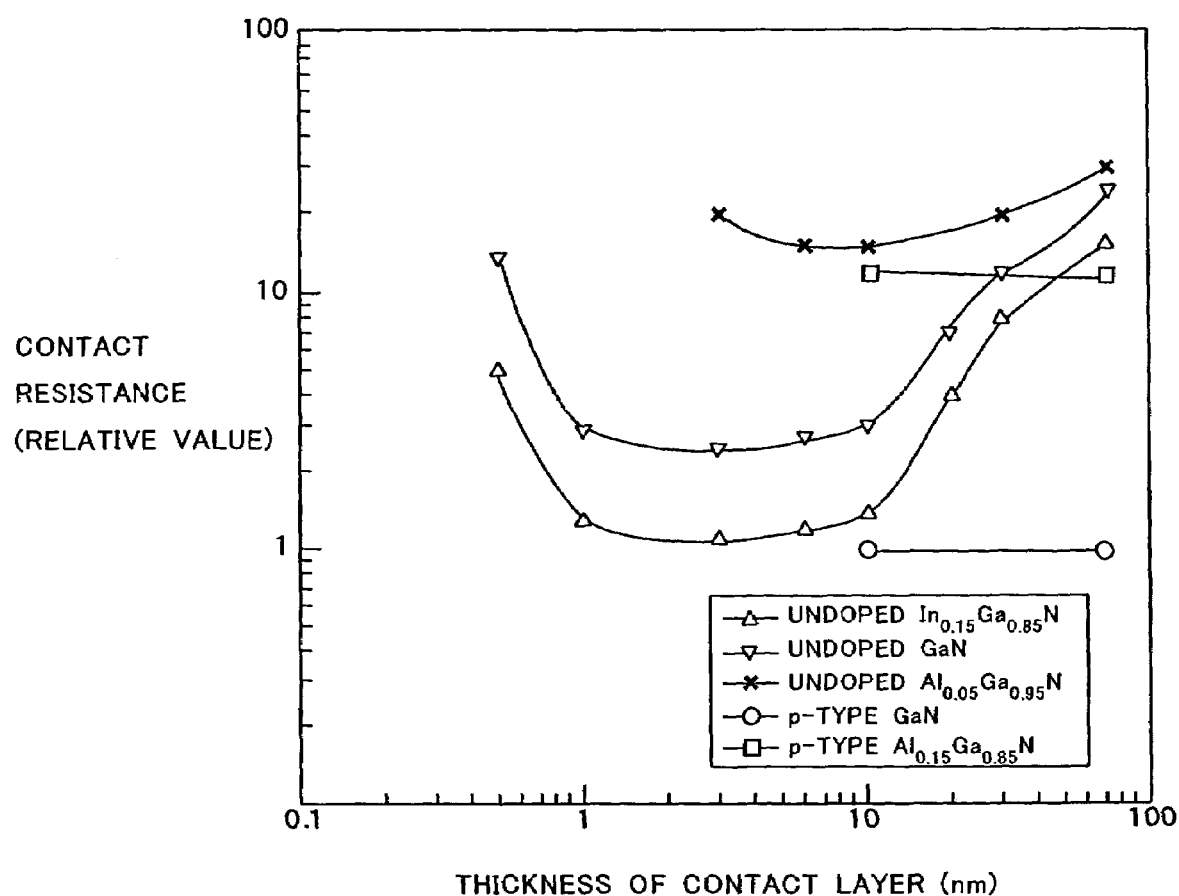
FIG. 3 is a graph showing contact resistance value between the p-side electrode and the contact layer consisting of various materials and having various thicknesses, in the nitride-based semiconductor light-emitting diode according to the first embodiment shown in FIG. 1.

FIG. 3 is a graph showing contact resistance value between the p-side electrode and the contact layer consisting of various materials and having various thicknesses. This graph shows relative contact resistance values with reference to a contact layer formed by a p-type GaN layer doped with Mg having a carrier concentration of about $1\times10^{18}$ cm$^{-3}$. p-type GaN doped with Mg is a standard material for a contact layer.

As shown in FIG. 3, it is understood possible to approach the contact resistance of the undoped contact layer 8 consisting of undoped $In_{0.15}Ga_{0.85}N$ to that of the p-type contact layer consisting of p-type GaN doped with Mg by setting the thickness thereof to about 1 nm to about 10 nm. It is also understood possible to reduce the contact resistance of an undoped contact layer consisting of undoped GaN to some extent by setting the thickness thereof to about 1 nm to about 10 nm. However, the contact resistance of the undoped contact layer 8 consisting of undoped $In_{0.15}Ga_{0.85}N$ can be more reduced as compared with the undoped contact layer consisting of undoped GaN. According to the first embodiment, the undoped contact layer 8 of undoped $In_{0.15}Ga_{0.85}N$ having the thickness of about 1 nm to about 10 nm is employed in consideration of the aforementioned point. It is understood that an undoped contact layer consisting of undoped $Al_{0.05}Ga_{0.95}N$ still exhibits large contact resistance also when the thickness thereof is set to about 1 nm to about 10 nm. It is further understood that a p-type contact layer consisting of p-type $Al_{0.15}Ga_{0.85}N$ exhibits high contact resistance of about ten times that of the p-type contact layer consisting of p-type GaN.

Referring again to FIGS. 1 and 2, a p-side pad electrode 10 constituted of a Ti film having a thickness of about 30 nm and an Au film having a thickness of about 500 nm in ascending order is formed on a partial region of the upper surface of the p-side electrode 9. An n-side electrode 11 of Al having a thickness of about 500 nm is formed on a partial region, excluding the projecting portion, of the surface of the n-type contact layer 4.

According to the first embodiment, as hereinabove described, the undoped contact layer 8 formed with no dopant levels can be prevented from light absorption resulting from dopant levels. Further, the undoped contact layer 8 having no crystal defects resulting from doping has excellent crystal quality. Therefore, the undoped contact layer 8 can be inhibited also from light absorption resulting from crystal defects. Thus, light absorption loss in the undoped contact layer 8 can be so reduced that the nitride-based semiconductor light-emitting diode can be improved in luminous efficiency.

According to the first embodiment, further, the band gap of the undoped contact layer 8 is rendered smaller than that of the p-type cladding layer 7 as hereinabove described to reduce the energy barrier at the interface between the undoped contact layer 8 and the p-side electrode 9, whereby ohmic contact can be easily implemented between the undoped contact layer 8 and the p-side electrode 9. Thus, the nitride-based semiconductor light-emitting diode can be further improved in luminous efficiency and reduced in operation voltage.

According to the first embodiment, in addition, the thickness of the undoped contact layer 8 is so set to about 1 nm to about 10 nm that the contact resistance between the undoped contact layer 8 and the p-side electrode 9 can be reduced, whereby excellent ohmic contact can be attained between the undoped contact layer 8 and the p-side electrode 9. Further, the resistance of the undoped contact layer 8 can be reduced.

According to the first embodiment, further, the p-type cladding layer 7 is prepared from p-type $Al_{0.05}Ga_{0.95}N$ doped with Mg as hereinabove described so that the band gap thereof can be easily increased for reducing light absorption in the p-type cladding layer 7. According to the first embodiment, in addition, the undoped contact layer 8 is prepared from $In_{0.15}Ga_{0.85}N$ so that the band gap thereof can be easily reduced beyond that of the p-type cladding layer 7. Further, the band gap of the undoped contact layer 8 is larger than that of the MQW active layer 5 as hereinabove described, whereby light absorption in the undoped contact layer 8 can be easily reduced.

A process of fabricating the nitride-based semiconductor light-emitting diode according to the first embodiment is now described with reference to FIGS. 1, 2, 4 and 5.

Figure 4:
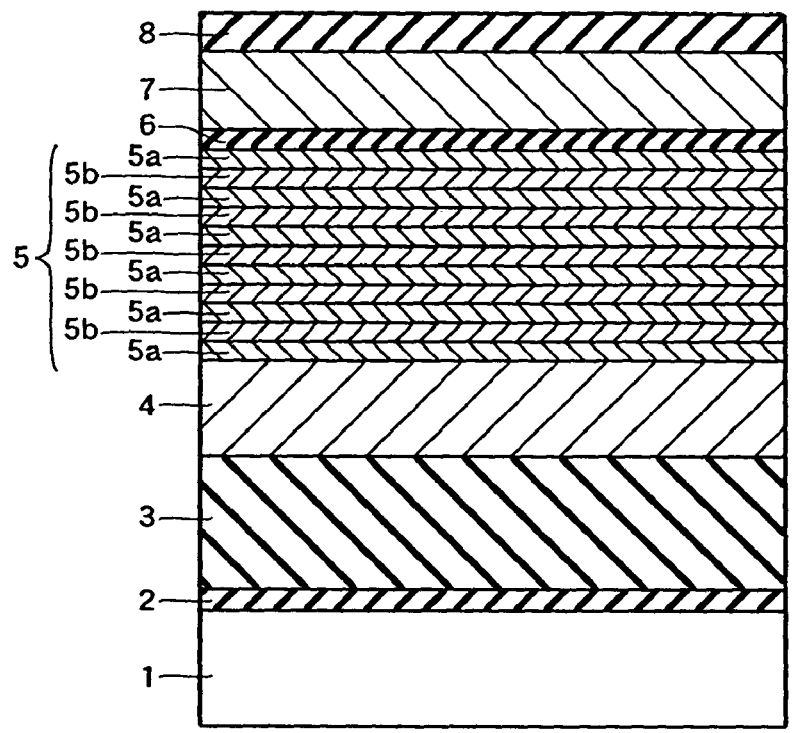
FIGS. 4 and 5 are sectional views for illustrating a process of fabricating the nitride-based semiconductor light-emitting diode according to the first embodiment shown in FIGS. 1 and 2.

As shown in FIG. 4, the low-temperature buffer layer 2, the high-temperature buffer layer 3, the n-type contact layer 4, the MQW active layer 5, the protective layer 6, the p-type cladding layer 7 and the undoped contact layer 8 are successively grown on the sapphire substrate 1 by MOVPE (metal organic vapor phase epitaxy).

More specifically, the low-temperature buffer layer 2 of AlGaN having the thickness of about 10 nm is grown on the (0001) plane of the sapphire substrate 1 held at a non-single-crystal growth temperature of about 600° C. with carrier gas consisting of $H_2$ and $N_2$ ($H_2$: about 50%) and material gas consisting of $NH_3$, trimethyl aluminum (TMAl) and trimethyl gallium (TMGa).

Then, the sapphire substrate 1 is held at a single-crystal growth temperature of about 1150° C. for growing the high-temperature buffer layer 3 of undoped GaN having the thickness of about 1 μm on the low-temperature buffer layer 2 at a growth rate of about 1 μm/h. with carrier gas consisting of $H_2$ and $N_2$ ($H_2$: about 50%) and material gas consisting of $NH_3$ and TMGa.

Then, the sapphire substrate 1 is held at a single-crystal growth temperature of about 1150° C. for growing the n-type contact layer 4 of n-type GaN doped with Si having the thickness of about 5 μm on the high-temperature buffer layer 3 at a growth rate of about 3 μm/h. with carrier gas consisting of $H_2$ and $N_2$ ($H_2$: about 50%), material gas consisting of $NH_3$ and TMGa and dopant gas consisting of $SiH_4$.

Then, the sapphire substrate 1 is held at a single-crystal growth temperature of about 850° C. for alternately growing the six barrier layers 5a of undoped $In_{0.15}Ga_{0.85}N$ each having the thickness of about 5 nm and the five well layers 5b of undoped $In_{0.35}Ga_{0.65}N$ each having the thickness of about 5 nm on the n-type contact layer 4 at a growth rate of about 0.4 nm/s. with carrier gas consisting of $H_2$ and $N_2$ ($H_2$: about 1% to about 5%) and material gas consisting of $NH_3$, triethyl gallium (TEGa) and trimethyl indium (TMIn). Thus, the MQW active layer 5 is formed on the n-type contact layer 4. Then, the protective layer 6 of undoped GaN having the thickness of about 10 nm is grown on the MQW active layer 5 at a growth rate of about 0.4 nm/s.

Then, the sapphire substrate 1 is held at a single-crystal growth temperature of about 1150° C. for growing the p-type cladding layer 7 of p-type $Al_{0.05}Ga_{0.95}N$ doped with Mg having the atomic density of about $3\times10^{19}$ cm$^{-3}$ and the carrier concentration of about $1\times10^{18}$ cm$^{-3}$ on the protective layer 6 with the thickness of about 0.15 μm at a growth rate of about 3 μm/h. with carrier gas consisting of $H_2$ and $N_2$ ($H_2$: about 1% to about 3%), material gas consisting of $NH_3$, TMGa and TMAl and dopant gas consisting of cyclopentadienyl magnesium ($Cp_2Mg$).

At this time, Mg serving as an acceptor can be activated by reducing the $H_2$ composition of the carrier gas to about 1% to 3%, whereby the p-type cladding layer 7 can be formed with the high carrier concentration.

Then, the sapphire substrate 1 is held at a single-crystal growth temperature of about 850° C. for growing the undoped contact layer 8 of undoped $In_{0.15}Ga_{0.85}N$ having the thickness of about 1 nm to about 10 nm on the p-type cladding layer 7 at a growth rate of about 3 μm/h. with carrier gas consisting of $H_2$ and $N_2$ ($H_2$: about 1% to about 5%) and material gas consisting of $NH_3$, TEGa and TMIn.

Figure 5:
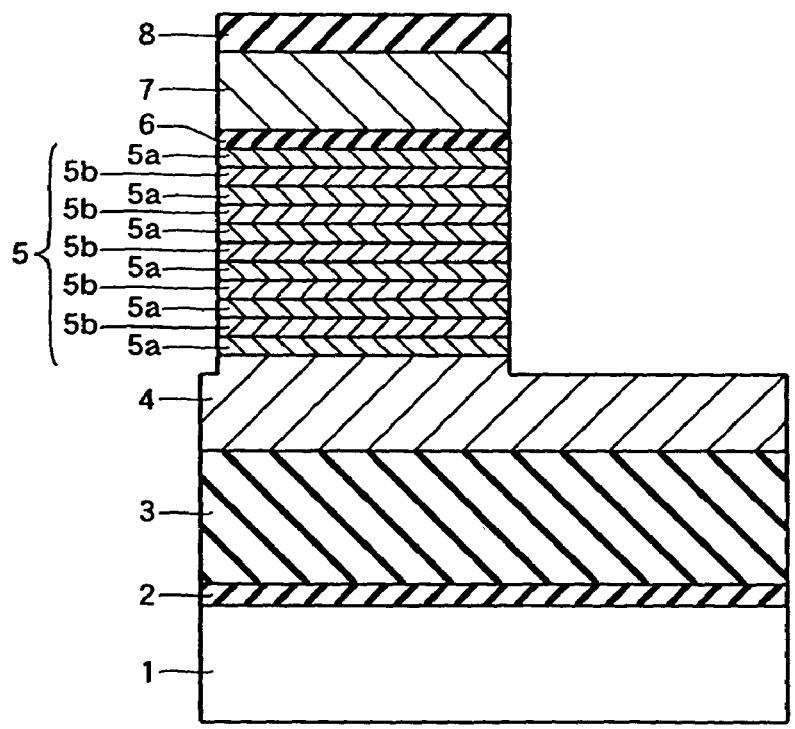

As shown in FIG. 5, partial regions of the undoped contact layer 8, the p-type cladding layer 7, the protective layer 6, the MQW layer 5 and the n-type contact layer 4 are removed by reactive ion beam etching (RIBE) or the like, thereby exposing the remaining partial region of the n-type contact layer 4.

Figure 2:
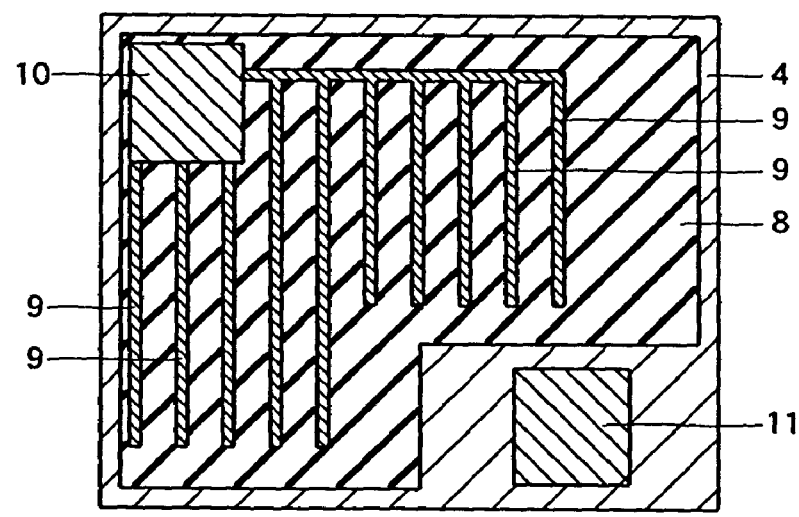
FIG. 2 is a top plan view of the nitride-based semiconductor light-emitting diode according to the first embodiment shown in FIG. 1.

As shown in FIGS. 1 and 2, the interdigital p-side electrode 9 constituted of the Pd film having the thickness of about 100 nm and the Au film having the thickness of about 100 nm in ascending order is formed on the upper surface of the undoped contact layer 8 by vacuum evaporation or the like. The p-side pad electrode 10 constituted of the Ti film having the thickness of about 30 nm and the Au film having the thickness of about 500 nm in ascending order is formed on the partial region of the upper surface of the p-side electrode 9. Further, the n-side electrode 11 of Al having the thickness of about 500 nm is formed on the exposed surface of the n-type contact layer 4.

Thereafter heat treatment is performed at a temperature of about 600° C., thereby bringing the p-side electrode 9 and the n-side electrode 11 into ohmic contact with the undoped contact layer 8 and the n-type contact layer 4 respectively.

Finally, element isolation is performed for obtaining a substantially square chip having edges of about 400 μm, for example, by scribing, dicing or braking. Thus, the nitride-based semiconductor light-emitting diode according to the first embodiment is fabricated.

An LED lamp including a blue LED chip according to the first embodiment may be prepared by mounting the nitride-based semiconductor light-emitting diode (blue LED chip) according to the first embodiment fabricated in the aforementioned manner to a frame (not shown) and hardening resin at a temperature of about 200° C. to cover the blue LED chip and the frame.

Second Embodiment

Figure 6:
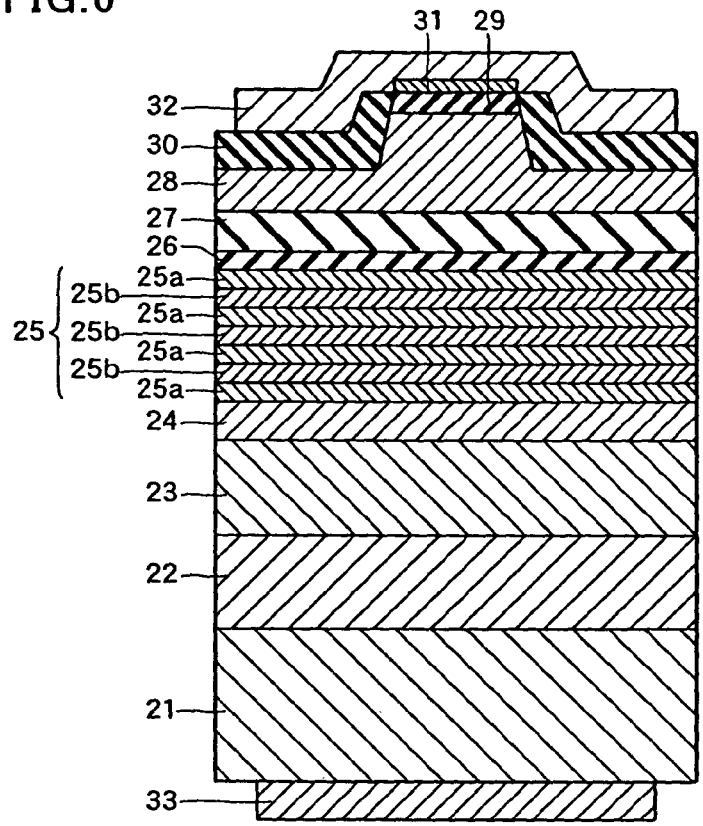
FIG. 6 is a sectional view showing a nitride-based semiconductor laser diode (LD chip) according to a second embodiment of the present invention.

Referring to FIG. 6, a second embodiment of the present invention is applied to a nitride-based semiconductor laser diode dissimilarly to the first embodiment applied to the nitride-based semiconductor light-emitting diode.

In the nitride-based semiconductor laser diode according to the second embodiment, an n-type GaN layer 22 doped with Si having a thickness of about 1 μm is formed on a conductive n-type GaN substrate 21 doped with oxygen having a surface of the (0001) Ga plane, as shown in FIG. 6. An n-type cladding layer 23 of n-type $Al_{0.15}Ga_{0.85}N$ doped with Si having a thickness of about 1 μm is formed on the n-type GaN layer 22. The n-type GaN substrate 21 is an example of the "substrate" in the present invention, and the n-type GaN layer 22 and the n-type cladding layer 23 are examples of the "first nitride-based semiconductor layer" in the present invention.

An n-type optical guide layer 24 of n-type GaN having a thickness of about 100 nm is formed on the n-type cladding layer 23. An MQW active layer 25 having a multiple quantum well structure obtained by alternately stacking four barrier layers 25a of undoped $In_{0.05}Ga_{0.95}N$ each having a thickness of about 15 nm and three well layers 25b of undoped $In_{0.1}Ga_{0.9}N$ each having a thickness of about 4 nm is formed on the n-type optical guide layer 24.

According to the second embodiment, a protective layer 26 of undoped $Al_{0.3}Ga_{0.7}N$ having a thickness of about 20 nm is formed on the MQW active layer 25. This protective layer 26 has a function of preventing In atoms in the MQW active layer 25 from desorption thereby preventing the MQW active layer 25 from deterioration of crystal quality. An optical guide layer 27 of undoped GaN having a thickness of about 100 nm is formed on the protective layer 26. The optical guide layer 27 of undoped GaN has a band gap smaller than that of a p-type cladding layer 28 of $Al_{0.15}Ga_{0.85}N$ described later. The optical guide layer 27 is an example of the "third nitride-based semiconductor layer" in the present invention.

The p-type cladding layer 28 of $Al_{0.15}Ga_{0.85}N$ doped with Mg having a thickness of about 280 nm with a striped projecting portion of about 1.5 μm in width around its central portion is formed on the optical guide layer 27. The p-type cladding layer 28 is an example of the "second nitride-based semiconductor layer" or the "cladding layer" in the present invention.

According to the second embodiment, an undoped contact layer 29 of undoped $In_{0.05}Ga_{0.95}N$ having a thickness of about 5 nm is formed on the projecting portion of the p-type cladding layer 28 consisting of $Al_{0.15}Ga_{0.85}N$. The projecting portion of the p-type cladding layer 28 and the undoped contact layer 29 constitute a ridge portion serving as a current path region. The band gap of the undoped contact layer 29 is smaller than that of the p-type cladding layer 28 and larger than that of the MQW active layer 25. The term "the band gap of the MQW active layer 25" denotes the energy gap between two quantum levels (ground states) formed in the conduction band and the valence band. The energy gap between the quantum levels of the MQW active layer 25 constituted of $In_{0.05}Ga_{0.95}N$ and $In_{0.1}Ga_{0.9}N$ is smaller than the band gap of the undoped contact layer 29 consisting of $In_{0.05}Ga_{0.95}N$.

An insulator film 30 of $SiO_2$ is formed to cover the surface of the p-type cladding layer 28 and the side surfaces of the undoped contact layer 29. A p-side electrode 31 constituted of a Pd film, a Pt film and an Au film in ascending order is formed on the undoped contact layer 29. The p-side electrode 31 is an example of the "electrode" in the present invention. A p-side pad electrode 32 is formed to cover the surfaces of the insulator film 30 and the p-side electrode 31. An n-side electrode 33 constituted of a Ti film, a Pt film and an Au film from the side closer to the back surface of the n-type GaN substrate 21 is formed on the back surface of the n-type GaN substrate 21.

According to the second embodiment, as hereinabove described, the undoped contact layer 29 formed with no dopant levels can be prevented from light absorption resulting from dopant levels. Further, the undoped contact layer 29 having no crystal defects resulting from doping exhibits excellent crystal quality. Therefore, the undoped contact layer 29 can also be inhibited from light absorption resulting from crystal defects. Thus, light absorption loss in the undoped contact layer 29 can be so reduced that the nitride-based semiconductor laser diode can be improved in luminous efficiency.

According to the second embodiment, further, the band gap of the undoped contact layer 29 is rendered smaller than that of the p-type cladding layer 28 as hereinabove described to reduce the energy barrier at the interface between the undoped contact layer 29 and the p-side electrode 31, whereby ohmic contact can be easily implemented between the undoped contact layer 29 and the p-side electrode 31.

According to the second embodiment, in addition, the p-type cladding layer 28 is constituted of p-type $Al_{0.15}Ga_{0.85}N$ doped with Mg as hereinabove described so that the band gap thereof can be easily increased for reducing light absorption in the p-type cladding layer 28. According to the second embodiment, further, the undoped contact layer 29 is prepared from $In_{0.05}Ga_{0.95}N$ so that the band gap thereof can be easily reduced beyond that of the p-type cladding layer 28. Further, the band gap of the undoped contact layer 29 is larger than that of the MQW active layer 25 as hereinabove described, whereby light absorption in the undoped contact layer 29 can be easily reduced.

According to the second embodiment, further, the undoped optical guide layer 27 having the band gap smaller than that of the p-type cladding layer 28 is provided between the MQW active layer 25 and the p-type cladding layer 28 as hereinabove described, whereby the optical guide layer 27 can control emission characteristics such as optical beam divergence, and can be inhibited from light absorption.

A process of fabricating the nitride-based semiconductor laser diode according to the second embodiment is now described with reference to FIGS. 6 to 9.

Figure 7:
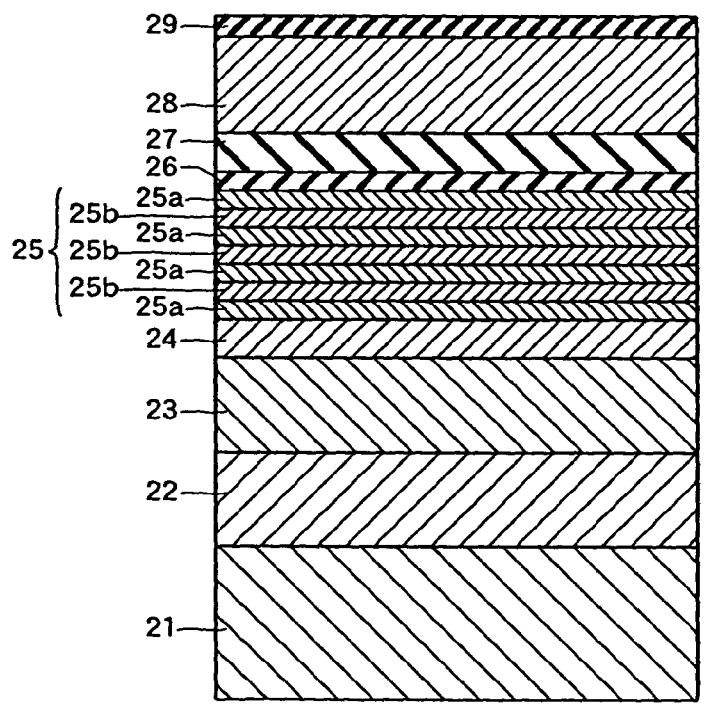
FIGS. 7 to 9 are sectional views for illustrating a process of fabricating the nitride-based semiconductor laser diode according to the second embodiment shown in FIG. 6.

As shown in FIG. 7, the n-type GaN layer 22, the n-type cladding layer 23, the n-type optical guide layer 24, the MQW active layer 25, the protective layer 26, the optical guide layer 27, the p-type cladding layer 28 and the undoped contact layer 29 are successively grown on the n-type GaN substrate 21 doped with oxygen having the surface of the (0001) Ga plane by MOVPE.

More specifically, the n-type GaN substrate 21 is held at a growth temperature of about 1150° C. for growing the n-type GaN layer 22 doped with Si having the thickness of about 1 μm on the n-type GaN substrate 21 doped with oxygen having the surface of the (0001) Ga plane at a growth rate of about 3 μm/h. with carrier gas consisting of $H_2$ and $N_2$ ($H_2$: about 50%), material gas consisting of $NH_3$ and TMGa and dopant gas consisting of $SiH_4$.

Then, the n-type GaN substrate 21 is held at a growth temperature of about 1150° C. for growing the n-type cladding layer 23 of n-type $Al_{0.15}Ga_{0.85}N$ doped with Si having the thickness of about 1 μm on the n-type GaN layer 22 at a growth rate of about 3 μm/h. with carrier gas consisting of $H_2$ and $N_2$ ($H_2$: about 50%), material gas consisting of $NH_3$, TMGa and TMAl and dopant gas consisting of $SiH_4$. Then, the n-type optical guide layer 24 of n-type GaN having the thickness of about 100 nm is grown on the n-type cladding layer 23 at a growth rate of about 3 μm/h.

Then, the n-type GaN substrate 21 is held at a growth temperature of about 850° C. for alternately growing the four barrier layers 25a of undoped $In_{0.05}Ga_{0.95}N$ each having the thickness of about 15 nm and the three well layers 25b of undoped $In_{0.1}Ga_{0.9}N$ each having the thickness of about 4 nm on the n-type optical guide layer 24 at a growth rate of about 0.4 nm/s. with carrier gas consisting of $H_2$ and $N_2$ ($H_2$: about 1% to about 5%) and material gas consisting of $NH_3$, TEGa and TMIn. Thus, the MQW active layer 25 is formed on the n-type optical guide layer 24. Then, the protective layer 26 of undoped $Al_{0.3}Ga_{0.7}N$ having the thickness of about 20 nm is grown on the MQW active layer 25 at a growth rate of about 0.4 nm/s.

Then, the n-type GaN substrate 21 is held at a growth temperature of about 1150° C. for growing the optical guide layer 27 of undoped GaN having the thickness of about 100 nm on the protective layer 26 at a growth rate of about 3 μm/h. with carrier gas consisting of $H_2$ and $N_2$ ($H_2$: about 1% to about 3%) and material gas consisting of $NH_3$ and TMGa. Material gas consisting of TMAl as well as dopant gas consisting of $Cp_2Mg$ are further added for growing the p-type cladding layer 28 of p-type $Al_{0.15}Ga_{0.85}N$ doped with Mg having the thickness of about 280 nm on the optical guide layer 27 at a growth rate of about 3 μm/h.

At this time, Mg serving as an acceptor can be activated by reducing the $H_2$ composition of the carrier gas to about 1% to 3%, whereby the p-type cladding layer 28 can be formed with the high carrier concentration.

Then, the n-type GaN substrate 21 is held at a growth temperature of about 850° C. for growing the undoped contact layer 29 of undoped $In_{0.05}Ga_{0.95}N$ having the thickness of about 5 nm on the p-type cladding layer 28 at a growth rate of about 3 μm/h with carrier gas consisting of $H_2$ and $N_2$ ($H_2$: about 1% to about 5%) and material gas consisting of $NH_3$, TEGa and TMIn.

Figure 8:
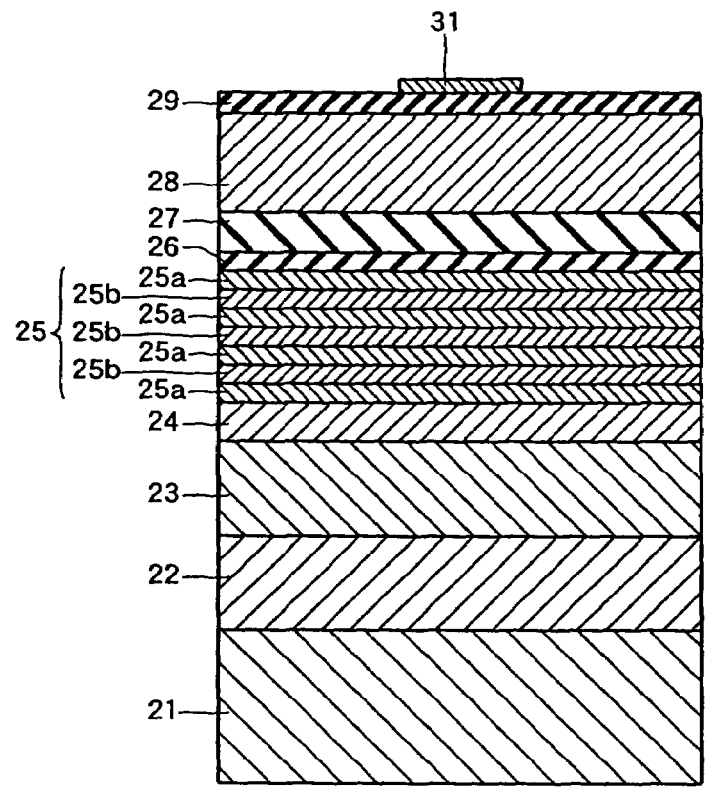

As shown in FIG. 8, the p-side electrode 31 constituted of the Pd film, the Pt film and the Au film in ascending order is formed on a portion around the center of the undoped contact layer 29 by vacuum evaporation and lithography in a striped manner with the width of about 1.5 μm.

Figure 9:
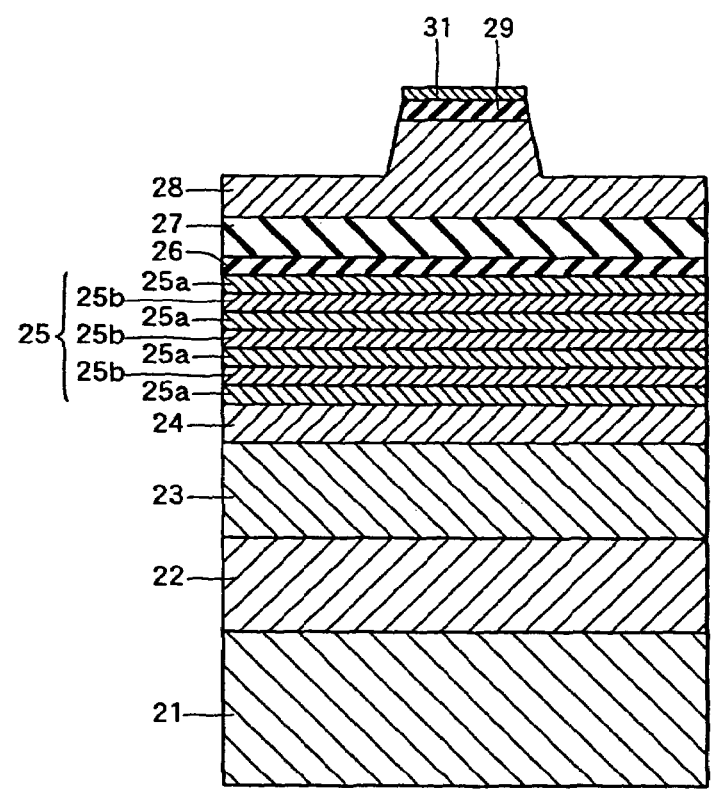

Thereafter partial regions of the undoped contact layer 29 and the p-type cladding layer 28 are removed by reactive ion beam etching or the like, as shown in FIG. 9. Thus, the projecting portion (ridge portion) is formed to serve as a current injection region.

Then, an insulator film (not shown) of $SiO_2$ is formed to cover the surfaces of the p-type cladding layer 28, the undoped contact layer 29 and the p-side electrode 31 by plasma CVD (chemical vapor deposition) and thereafter partially removed from the surface of the p-side electrode 31, thereby obtaining the insulator film 30 in the shape shown in FIG. 6. The p-side pad electrode 32 is formed to cover the surfaces of the insulator film 30 and the p-side electrode 31.

Finally, the n-type GaN substrate 21 is polished to a prescribed thickness of about 100 μm, for example, and the n-side electrode 33 constituted of the Ti film, the Pt film and the Au film from the side closer to the back surface of the n-type GaN substrate 21 is thereafter formed on the back surface of the n-type GaN substrate 21. Thus, the nitride-based semiconductor laser diode according to the second embodiment is formed.

Third Embodiment

Figure 10:
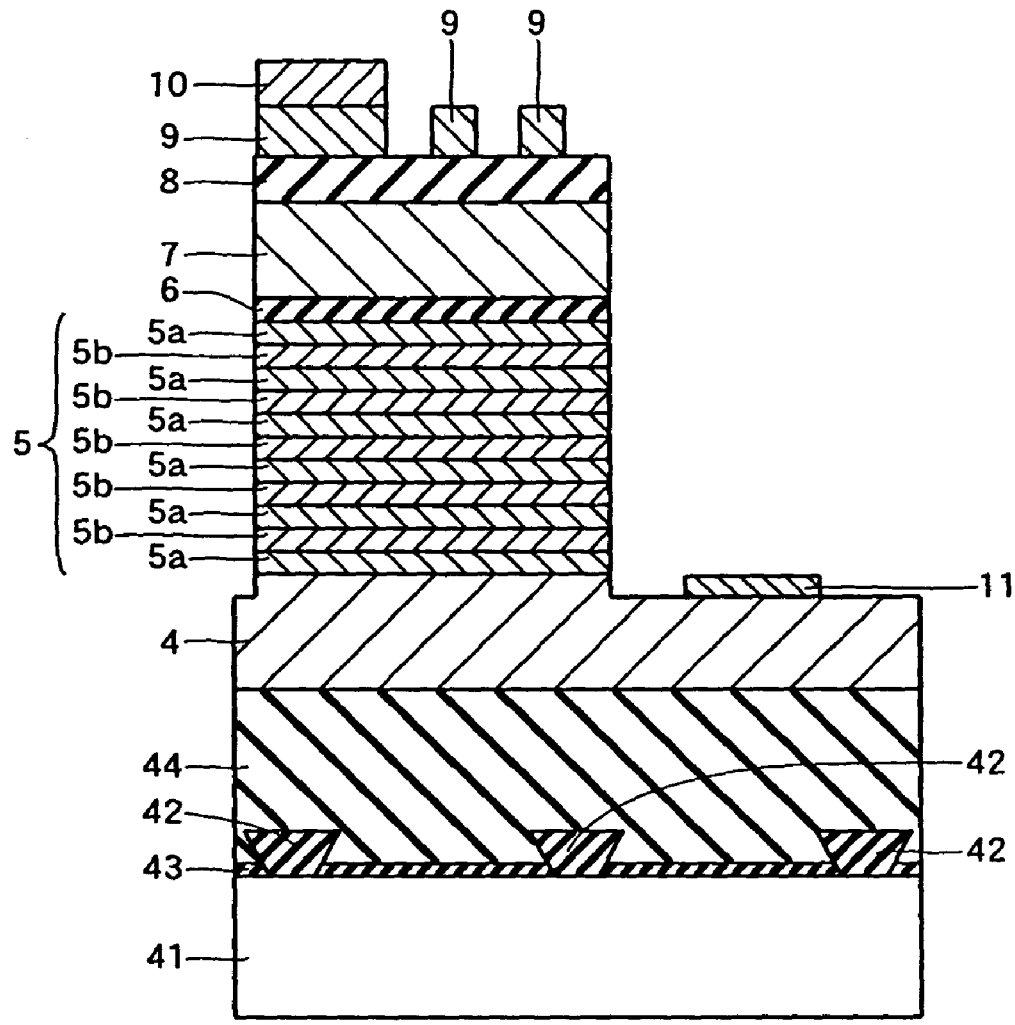
FIG. 10 is a sectional view showing a nitride-based semiconductor light-emitting diode (blue LED chip) according to a third embodiment of the present invention.

Referring to FIG. 10, a nitride-based semiconductor light-emitting diode according to a third embodiment of the present invention is formed with an undoped GaN layer 44 having a lower dislocation density in place of the high-temperature buffer layer 3 formed in the aforementioned first embodiment. The remaining structure of the third embodiment is similar to that of the first embodiment.

In the nitride-based semiconductor light-emitting diode according to the third embodiment, mask layers 42 of SiN each having a thickness of about 10 nm to about 1000 nm with an inverted mesa (inverted trapezoidal) section are formed on the (0001) plane of a sapphire substrate 41 in a striped (elongated) manner with a cycle of about 7 μm. The sapphire substrate 41 is an example of the "substrate" or the "insulating substrate" in the present invention. The mask layers 42 are so formed that the minimum distance between adjacent ones of the mask layers 42 is smaller than the width of the portions of the sapphire substrate 42 exposed between the mask layers 42.

Low-temperature buffer layers 43 of AlGaN or GaN having a thickness of about 10 nm to about 50 nm are formed on the portions of the sapphire substrate 41 exposed between the mask layers 42. The low-dislocation undoped GaN layer 44 having a thickness of about 2 μm is formed on the low-temperature buffer layers 43 and the mask layers 42 by selective lateral growth to fill up the clearances between the mask layers 42. The undoped GaN layer 44 is an example of the "fifth nitride-based semiconductor layer" in the present invention.

An n-type contact layer 4, an MQW active layer 5, a protective layer 6, a p-type cladding layer 7, an undoped contact layer 8, a p-side electrode 9, a p-side pad electrode 10 and an n-side electrode 11 formed on the undoped GaN layer 44 are similar in thickness and composition to those of the first embodiment shown in FIG. 1.

According to the third embodiment, the nitride-based semiconductor layers 4 to 8 formed on the undoped GaN layer 44 having a lower dislocation density than the high-temperature buffer layer 3 (see FIG. 1) according to the first embodiment can be further inhibited from formation of crystal defects. Thus, the nitride-based semiconductor layers 4 to 8 can be formed with smaller numbers of crystal defects, to be further inhibited from light absorption resulting from crystal defects. Consequently, a blue LED chip having higher luminous efficiency can be fabricated.

The remaining effects of the third embodiment are similar to those of the first embodiment.

A process of fabricating the nitride-based semiconductor light-emitting diode according to the third embodiment is now described with reference to FIGS. 10 to 13.

Figure 11:
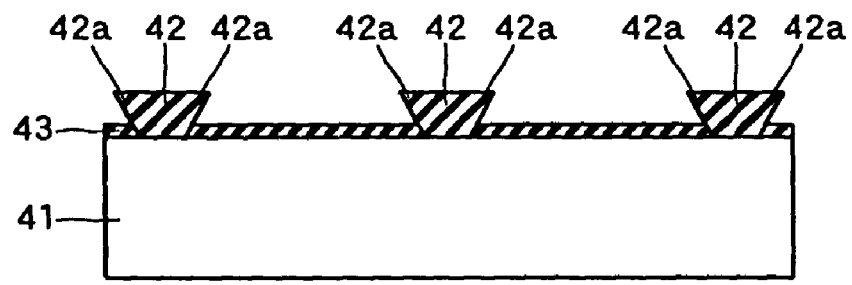
FIGS. 11 to 13 are sectional views for illustrating a process of fabricating the nitride-based semiconductor light-emitting diode according to the third embodiment shown in FIG. 10.

As shown in FIG. 11, an SiN film (not shown) is formed on the overall surface of the sapphire substrate 41, and photoresist layers (not shown) are thereafter formed on prescribed regions of the SiN film. The photoresist layers are employed as masks for wet-etching the SiN film, thereby forming the striped mask layers 42. The mask layers 42 are in the form of inverted mesas (inverted trapezoids) having overhangs 42a. Openings of the mask layers 42 are preferably formed in the [11-20] direction or the [1-100] direction of the sapphire substrate 41, for example. Thereafter the low-temperature buffer layers 43 of AlGaN or GaN having the thickness of about 10 nm to about 50 nm are selectively grown on the portions of the sapphire substrate 41 exposed between the mask layers 42 at a growth temperature of about 500° C. to about 700° C.

Figure 12:
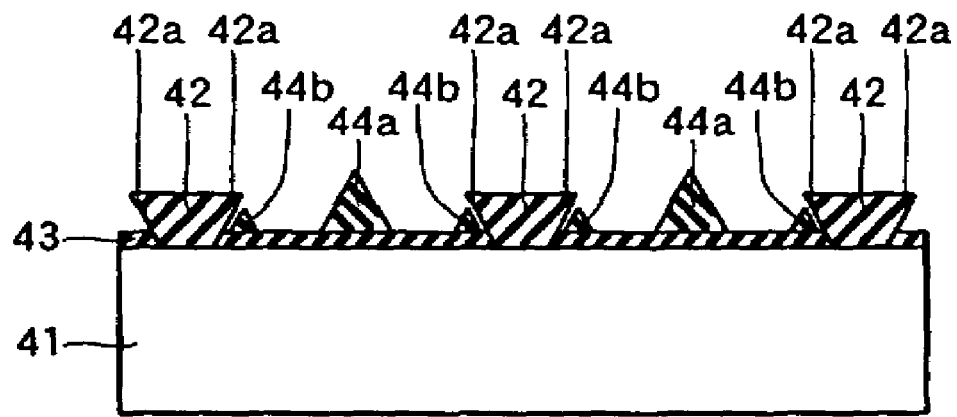
Figure 13:
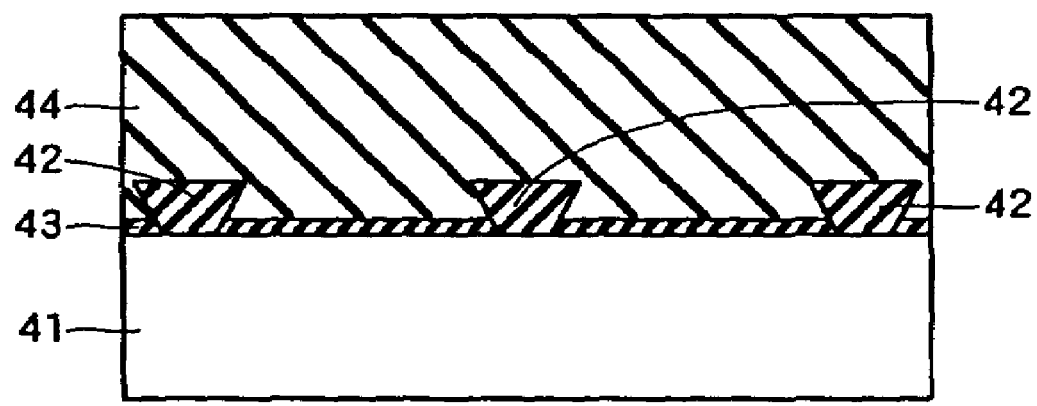

Then, the mask layers 42 are employed as selective growth masks for laterally growing the undoped GaN layer 44 (see FIG. 13) on the low-temperature buffer layers 43 by MOVPE at a growth temperature of about 950° C. to about 1200° C. In this case, the undoped GaN layer 44 is first upwardly grown on the exposed upper surfaces of the low-temperature buffer layers 43. Thus, undoped GaN layers 44a of a facet structure having triangular sections are grown around the centers of the clearances between the mask layers 42 in the initial growth stage, as shown in FIG. 12. Further, undoped GaN layers 44b of a facet structure smaller than the undoped GaN layers 44a are formed under the overhangs 42a. These undoped GaN layers 44a and 44b are further laterally grown also on the mask layers 42, to coalesce into the undoped GaN layer 44. Thus, the undoped GaN layer 44 having an upper surface consisting of a flat continuous film is formed with the thickness of about 2 μm.

Thus, the undoped GaN layer 44 is laterally grown from the initial growth stage, whereby dislocations formed therein are laterally bent from the initial growth stage. Consequently, the undoped GaN layer 44 can be formed with a smaller thickness and a dislocation density reduced to about $7 \times 10^7$ cm$^{-2}$.

Thereafter the n-type contact layer 4, the MQW active layer 5, the protective layer 6, the p-type cladding layer 7 and the undoped contact layer 8 are successively formed on the undoped GaN layer 44 as shown in FIG. 10 through a fabrication process similar to that in the first embodiment, and the layers from the undoped contact layer 8 through the n-type contact layer 4 is partially removed. The p-side electrode 9 and the p-side pad electrode 10 are successively formed on the undoped contact layer 8. Thereafter the n-side electrode 11 is formed on the exposed surface of the n-type contact layer 4.

Finally, element isolation is performed for obtaining a substantially square chip having edges of about 400 μm, for example, by scribing, dicing or braking. Thus, the nitride-based semiconductor light-emitting diode according to the third embodiment is fabricated.

Fourth Embodiment

Figure 14:
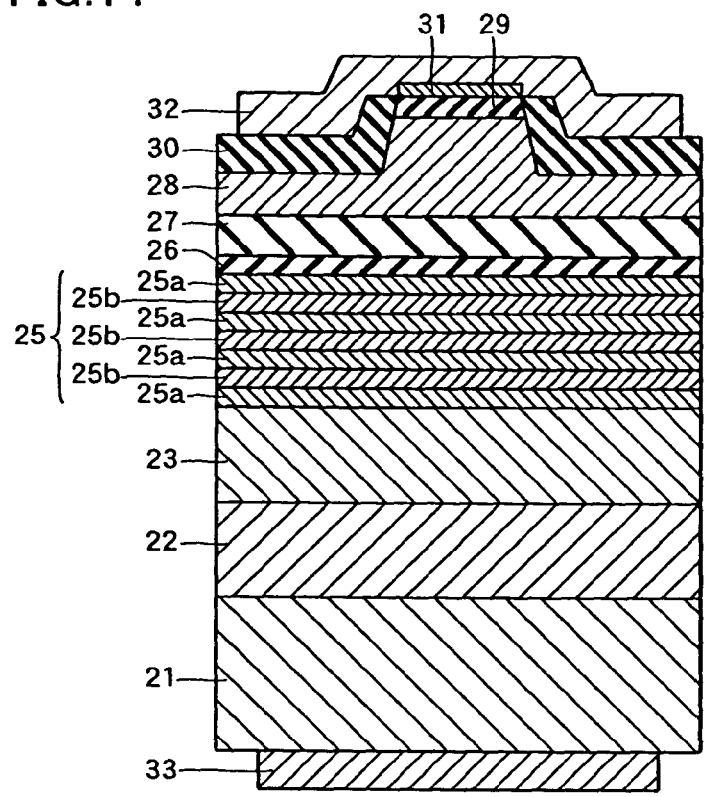
FIG. 14 is a sectional view showing a nitride-based semiconductor laser diode (LD chip) according to a fourth embodiment of the present invention.

Referring to FIG. 14, a nitride-base semiconductor laser diode according to a fourth embodiment of the present invention is provided with no n-type optical guide layer 24 dissimilarly to the aforementioned second embodiment. The remaining structure of the further embodiment is similar to that of the second embodiment.

In the nitride-based semiconductor laser diode according to the fourth embodiment, an n-type GaN layer 22 and an n-type cladding layer 23 similar in thickness and composition to those in the second embodiment are successively formed on a conductive n-type GaN substrate 21 doped with oxygen having a surface of the (0001) Ga plane, as shown in FIG. 14.

According to the fourth embodiment, an MQW active layer 25 is formed by stacking four barrier layers 25a and three well layers 25b similar in thickness and composition to those in the second embodiment immediately on the n-type cladding layer 23. In other words, no n-type optical guide layer is provided between the n-type cladding layer 23 and the MQW active layer 25 in the fourth embodiment.

A protective layer 26, an optical guide layer 27, a p-type cladding layer 28, an undoped contact layer 29, an insulator film 30, a p-side electrode 31 and a p-side pad electrode 32 formed on the MQW active layer 25 are similar in thickness and composition to those of the second embodiment shown in FIG. 6. An n-side electrode 33 formed on the back surface of the n-type GaN substrate 21 is also similar in thickness and composition to that of the second embodiment shown in FIG. 6.

According to the fourth embodiment, no n-type optical guide layer is provided between the n-type cladding layer 23 and the MQW active layer 25 as hereinabove described, whereby a region having high light intensity formed in the active layer 25 deviates toward the p-side, to inhibit the n-type cladding layer 23 from light absorption. Also when the region having high light intensity deviates toward the p-side in this case, the undoped contact layer 29 is formed with no dopant levels or crystal defects resulting from doping, whereby light absorption is not increased. Consequently, an effect of improving luminous efficiency of the nitride-based semiconductor laser diode is increased.

The remaining effects of the fourth embodiment are similar to those of the second embodiment.

A process of fabricating the nitride-based semiconductor laser diode according to the fourth embodiment is now described with reference to FIGS. 14 to 17.

Figure 15:
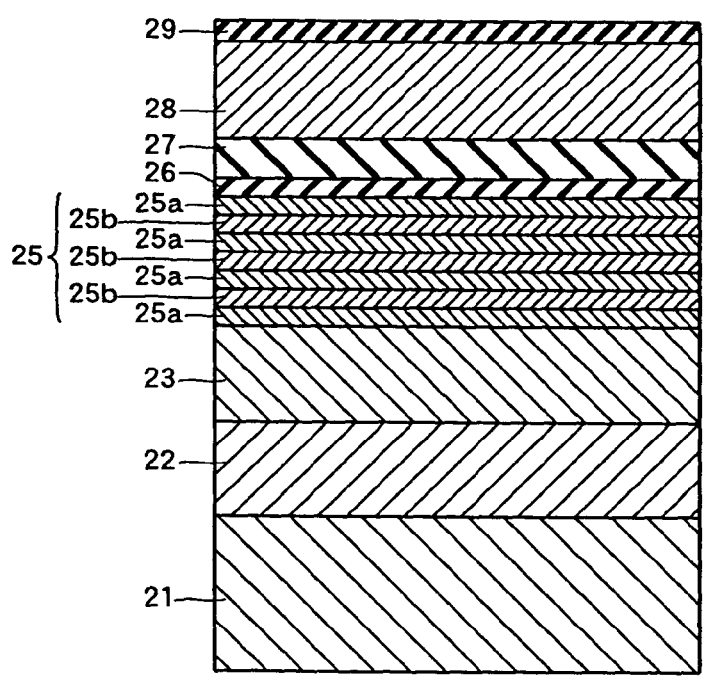
FIGS. 15 to 17 are sectional views for illustrating a process of fabricating the nitride-based semiconductor laser diode according to the fourth embodiment shown in FIG. 14.

As shown in FIG. 15, the n-type GaN layer 22 and the n-type cladding layer 23 are successively grown on the n-type GaN substrate 21 doped with oxygen having the surface of the (0001) Ga plane by MOCVD. According to the fourth embodiment, the four barrier layers 25a and the three well layers 25b are thereafter alternately grown immediately on the n-type cladding layer 23 thereby forming the MQW active layer 25. Thereafter the protective layer 26, the optical guide layer 27, the p-type cladding layer 28 and the undoped contact layer 29 are successively grown on the MQW active layer 25. The n-type GaN layer 22, the n-type cladding layer 23, the MQW active layer 25, the protective layer 26, the optical guide layer 27, the p-type cladding layer 28 and the undoped contact layer 29 are grown at substrate temperatures with introduced gas similar to those in the second embodiment respectively.

Figure 16:
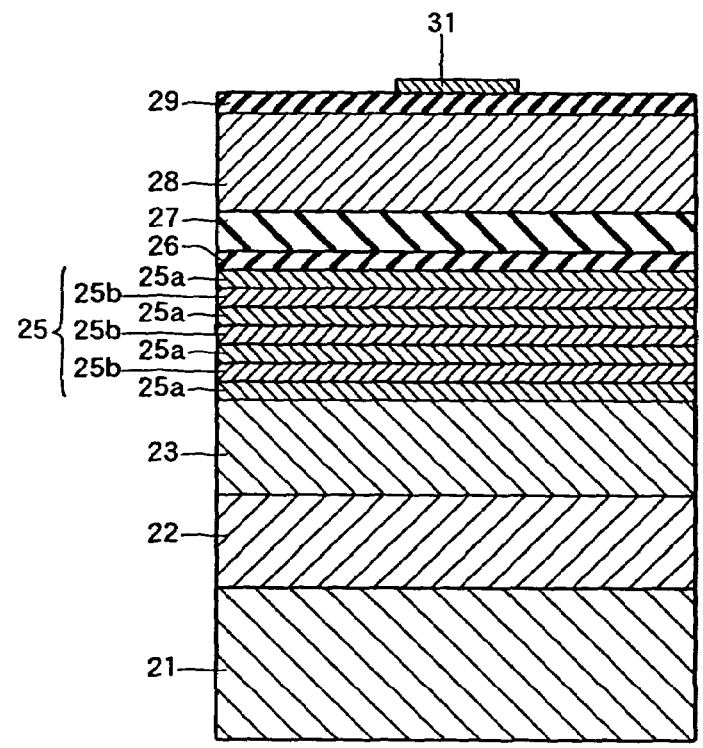
Figure 17:
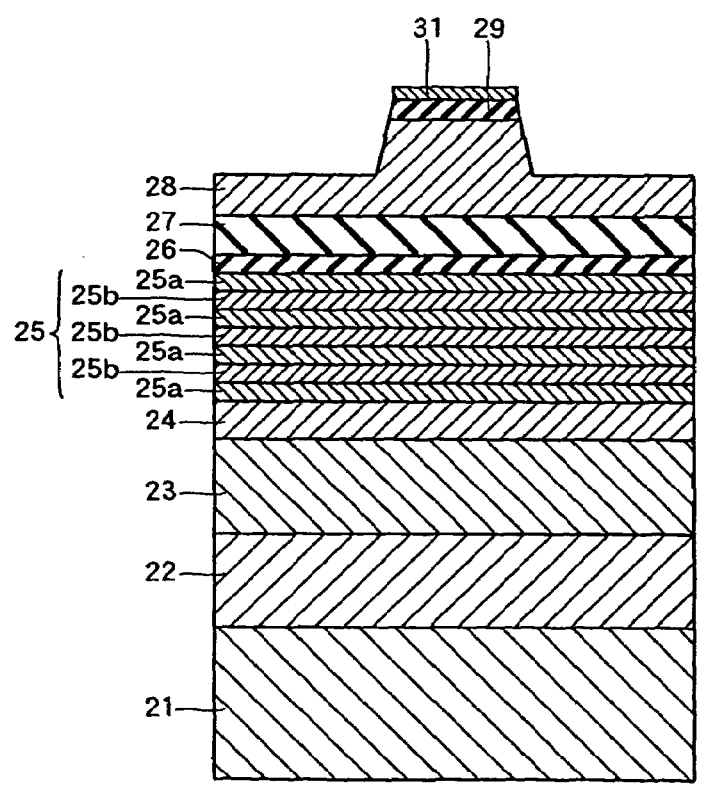

As shown in FIG. 16, the striped p-side electrode 31 is formed on a portion around the center of the undoped contact layer 29 by vacuum evaporation and lithography, similarly to the second embodiment. Thereafter the p-side electrode 31 is employed as a mask for removing partial regions of the undoped contact layer 29 and the p-type cladding layer 28 by reactive ion beam etching or the like, thereby forming a projecting ridge portion serving as a current path region as shown in FIG. 17.

Finally, the insulator film 30 is formed to cover the surface of the p-type cladding layer 28 and the side surfaces of the undoped contact layer 29 by plasma CVD and the p-side pad electrode 32 is thereafter formed to cover the surfaces of the insulator film 30 and the p-side electrode 31 similarly to the second embodiment, as shown in FIG. 14. Thereafter the n-type GaN substrate 21 is polished to a prescribed thickness, and the n-side electrode 33 is formed on the back surface of the n-type GaN substrate 21 by vacuum evaporation thereby fabricating the nitride-based semiconductor laser diode according to the fourth embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the sapphire substrate 1 or 41 or the n-type GaN substrate 21 is employed as the substrate in each of the aforementioned first to fourth embodiments, the present invention is not restricted to this but a spinel substrate, a silicon substrate, an SiC substrate, a GaAs substrate, a GaP substrate, an InP substrate, a quartz substrate, a $ZrB_2$ substrate or the like may alternatively be employed.

Figure 18:
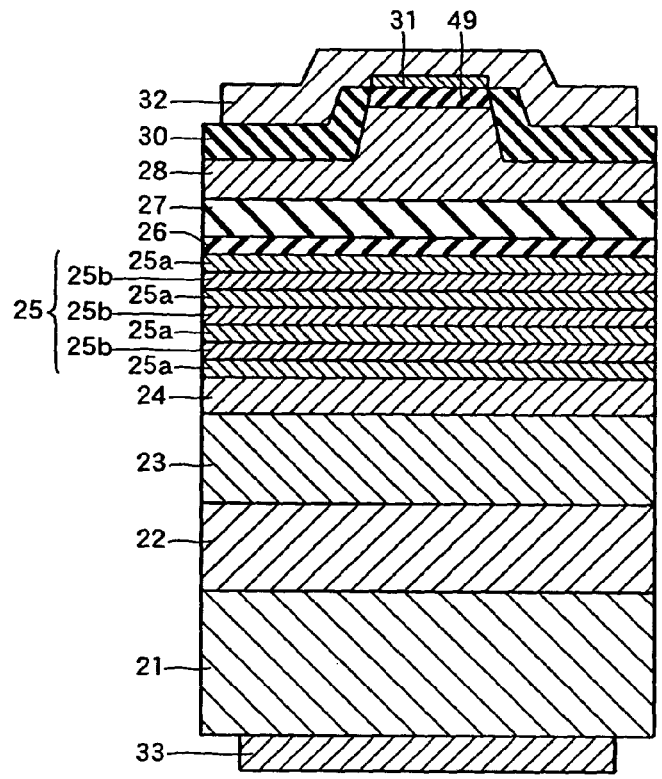
FIGS. 18 to 20 are sectional views showing a nitride-based semiconductor laser diode (LD chip) according to a modification of the second embodiment.

While the undoped contact layer 8 or 29 consists of a single layer of undoped InGaN in each of the aforementioned first to fourth embodiments, the present invention is not restricted to this but a p-side contact layer 49 having a multilayer structure such as a superlattice structure consisting of a plurality of undoped layers including at least a single layer consisting of undoped InGaN or the like having a band gap larger than that of an active layer 25 may alternatively be formed as shown in FIG. 18. In this case, the superlattice structure may conceivably be formed by stacking a layer of undoped $In_XGa_{1-X}N$ having a thickness of several nm and a layer of undoped $In_YGa_{1-Y}N$ (X>Y>0) having a thickness of several nm or stacking a layer of undoped InGaN having a thickness of several nm and a layer of undoped AlGaN (including GaN) having a thickness of several nm.

While the nitride-based semiconductor layers are so stacked that the surfaces thereof are along the (0001) planes in each of the aforementioned first to fourth embodiments, the present invention is not restricted to this but the nitride-based semiconductor layers may alternatively be stacked along other orientations. For example, these layers may alternatively be stacked so that the surfaces thereof are along the (H, K, —H—K, 0) planes such as the (1-100) planes or the (11-20) planes. In this case, no piezoelectric field is generated in the MQW active layer 5 or 25 and hence a recombination probability of holes and electrons can be inhibited from reduction resulting from inclination of energy bands of the well layers 5b or 25b. Consequently, the MQW active layer 5 or 25 can be improved in luminous efficiency.

While the active layer 5 or 25 is in the multiple quantum well (MQW) structure in each of the aforementioned first to fourth embodiments, the present invention is not restricted to this but a thick single active layer having no quantum effect or an active layer of a single quantum well structure can also attain similar effects.

Figure 19:
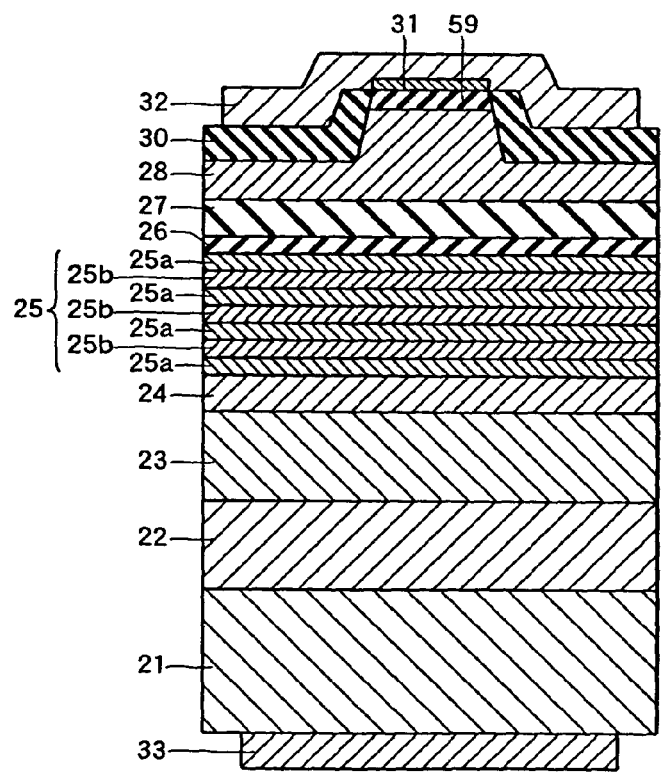

While the undoped contact layer 8 or 29 of InGaN is provided on the p-side in each of the aforementioned first to fourth embodiments, the present invention is not restricted to this but an undoped contact layer of GaN may alternatively be provided on the p-side. In the structure of the nitride-based semiconductor laser diode according to the second embodiment, for example, an undoped contact layer 59 of GaN may be provided in place of the undoped contact layer 29 of InGaN, as shown in FIG. 19. In other words, the undoped contact layer 59 of GaN is formed on a projecting portion of a p-type cladding layer 28, dissimilarly to the second embodiment. Effects such as suppression of light absorption can be attained similarly to the second embodiment also when the undoped contact layer 59 of GaN is provided.

Figure 20:
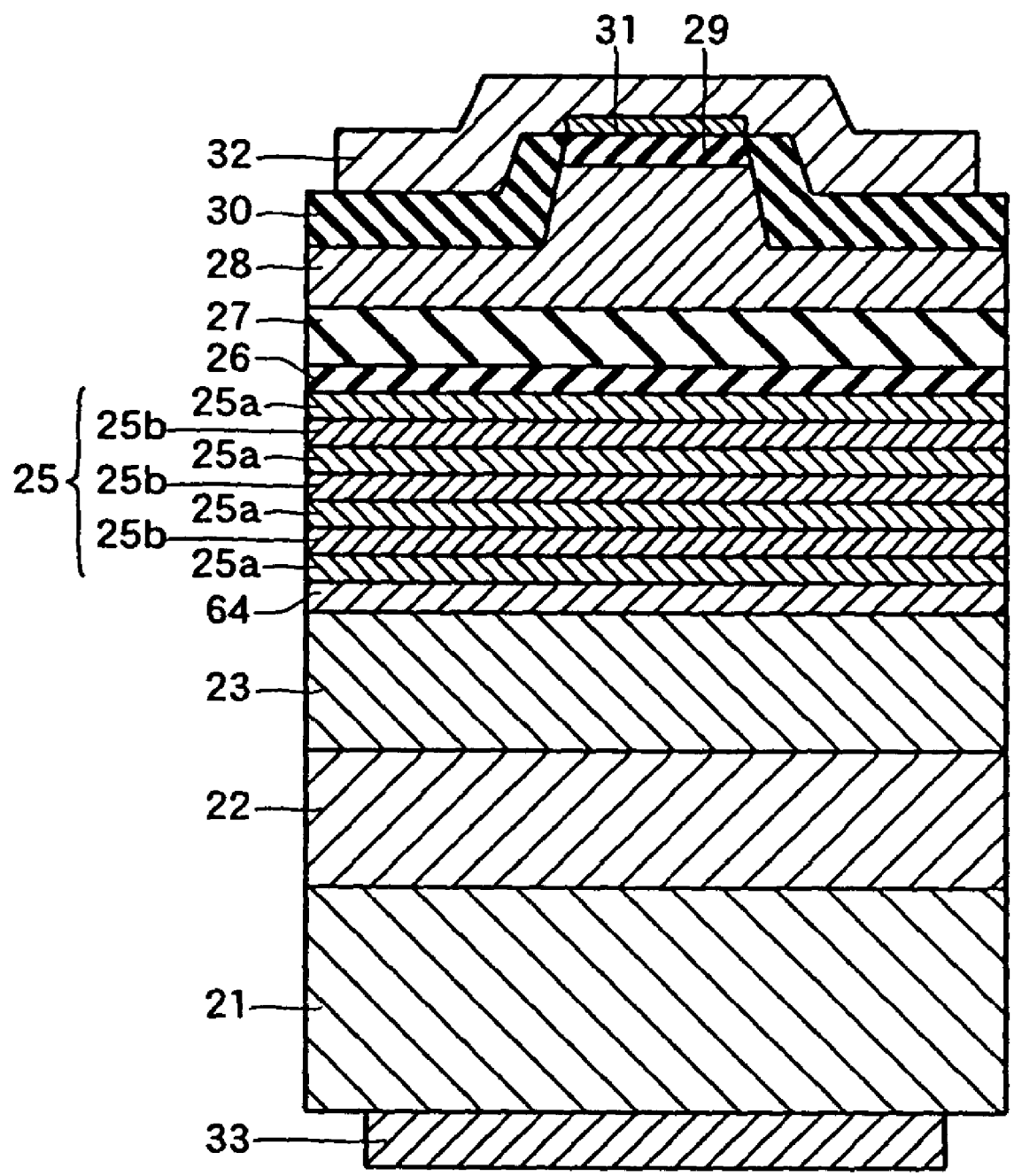

While the n-type optical guide layer 24 and the optical guide layer 27 having the same thicknesses of about 100 nm are provided on the n- and p-sides respectively in the aforementioned second embodiment, the present invention is not restricted to this but an n-type optical guide layer 64 having a thickness of about 50 nm, for example, smaller than that of an optical guide layer 27 may alternatively be provided, as shown in FIG. 20. In this case, an effect similar to that of the fourth embodiment provided with no n-type optical guide layer can be attained. In other words, a region having high light intensity deviates toward the p-side due to the thickness of the n-type optical guide layer 64 smaller than that of the p-side optical guide layer 27, thereby inhibiting an n-type cladding layer 23 from light absorption. In this case, further, light absorption is not increased in an undoped contact layer 29 formed with no dopant levels or crystal defects resulting from doping similarly to the fourth embodiment, whereby an effect of improving luminous efficiency of a nitride-based semiconductor laser diode is increased.

What is claimed is:

1. A nitride-based semiconductor light-emitting device comprising:
    a first conductivity type first nitride-based semiconductor layer formed on a substrate;
    an active layer, formed on said first nitride-based semiconductor layer;
    a first undoped optical guide layer formed on said active layer;
    a second conductivity type second nitride-based semiconductor layer, having a single layer structure with a thickness of at least 0.1 µm, formed on said first undoped optical guide layer;
    an undoped contact layer formed directly on said second nitride-based semiconductor layer; and
    an electrode formed directly on said undoped contact layer, wherein
    said undoped contact layer consists of a nitride-based semiconductor and has a single-layer structure and a thickness of at least about 1 nm and not more than about 10 nm, and the undoped contact layer does not include Al.

2. The nitride-based semiconductor light-emitting device according to claim 1, wherein
    the band gap of said undoped contact layer is smaller than the band gap of said second nitride-based semiconductor layer.

3. The nitride-based semiconductor light-emitting device according to claim 1, wherein
    said second conductivity type second nitride-based semiconductor layer includes a second conductivity type cladding layer consisting of AlGaN.

4. The nitride-based semiconductor light-emitting device according to claim 1, wherein
    said first conductivity type first nitride-based semiconductor layer is an n-type first nitride-based semiconductor layer, and
    said second conductivity type second nitride-based semiconductor layer is a p-type second nitride-based semiconductor layer.

5. The nitride-based semiconductor light-emitting device according to claim 1, wherein
    said undoped contact layer has a band gap larger than the band gap of said active layer.

6. The nitride-based semiconductor light-emitting device according to claim 1, wherein
    said undoped contact layer contains InGaN.

7. The nitride-based semiconductor light-emitting device according to claim 1, wherein
    said undoped contact layer contains GaN.

8. The nitride-based semiconductor light-emitting device according to claim 1, wherein
    said undoped contact layer has a multilayer structure consisting of a plurality of undoped nitride-based semiconductor layers.

9. The nitride-based semiconductor light-emitting device according to claim 1, wherein
    an optical guide layer is not formed between said active layer and said first conductivity type first nitride-based semiconductor layer.

10. The nitride-based semiconductor light-emitting device according to claim 1, wherein
    said second conductivity type second nitride-based semiconductor layer includes a second conductivity type second nitride-based semiconductor layer consisting of AlGaN, and
    said first undoped optical guide layer includes an undoped optical guide layer consisting of GaN.

11. The nitride-based semiconductor light-emitting device according to claim 1, wherein
    said second conductivity type second nitride-based semiconductor layer includes a second conductivity type cladding layer having a projecting portion,
    said undoped contact layer is formed on the upper surface of said projecting portion of said second conductivity type cladding layer, and
    said projecting portion of said second conductivity type cladding layer and said undoped contact layer constitute a ridge portion.

12. The nitride-based semiconductor light-emitting device according to claim 1, wherein
    said active layer includes an active layer consisting of a nitride-based semiconductor containing In,
    said nitride-based semiconductor light-emitting device further comprising a protective layer of a nitride-based semiconductor layer formed on said active layer for preventing In contained in said active layer from desorption.

13. The nitride-based semiconductor light-emitting device according to claim 1, wherein said first conductivity type first nitride-based semiconductor layer includes a first conductivity type contact layer, and said first conductivity type contact layer also has a function for serving as a first conductivity type cladding layer.

14. The nitride-based semiconductor light-emitting device according to claim 13, wherein
said substrate includes an insulating substrate.

15. The nitride-based semiconductor light-emitting device according to claim 1, wherein
said electrode provided on said undoped contact layer is interdigitally formed.

16. The nitride-based semiconductor light-emitting device according to claim 1, further comprising an undoped fifth nitride-based semiconductor layer formed between said substrate and said first conductivity type first nitride-based semiconductor layer.

17. The nitride-based semiconductor light-emitting device according to claim 16, wherein
said undoped fifth nitride-based semiconductor layer is constituted of a nitride-based semiconductor having a low dislocation density formed by selective lateral growth.

18. The nitride-based semiconductor light-emitting device according to claim 16, further comprising a plurality of mask layers having overhangs formed on said substrate at prescribed intervals, wherein
said undoped fifth nitride-based semiconductor layer is formed by selective lateral growth to fill up clearances between said mask layers.

19. The nitride-based semiconductor light-emitting device according to claim 1, wherein
said substrate is a first conductivity type GaN substrate.

20. The nitride-based semiconductor light-emitting device according to claim 1, wherein
a second undoped optical guide layer is formed between the first nitride-based semiconductor layer and said active layer.

21. The nitride-based semiconductor light-emitting device according to claim 20, wherein
said second undoped optical guide layer has a thickness smaller than the thickness of said first undoped optical guide layer.

22. A nitride-based semiconductor light-emitting device comprising:
a first conductivity type first nitride-based semiconductor layer formed on a substrate;
an active layer, formed on said first nitride-based semiconductor layer;
a second conductivity type second nitride-based semiconductor layer, having a single layer structure with a thickness of at least 0.1 µm, formed on said active layer;
an undoped contact layer formed directly on said second nitride-based semiconductor layer; and
an electrode formed directly on said undoped contact layer, wherein
said undoped contact layer consists of a nitride-based semiconductor and has a thickness of at least about 1 nm and not more than about 10 nm.

* * * * *